(12) United States Patent
Rhodes et al.

(10) Patent No.: US 7,943,505 B2
(45) Date of Patent: May 17, 2011

(54) ADVANCED VLSI METALLIZATION

(75) Inventors: Howard E. Rhodes, Boise, ID (US); Steven D. Cummings, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1028 days.

(21) Appl. No.: 10/871,242

(22) Filed: Jun. 18, 2004

(65) Prior Publication Data

US 2004/0229455 A1 Nov. 18, 2004

Related U.S. Application Data

(62) Division of application No. 08/815,031, filed on Mar. 14, 1997, now abandoned.

(51) Int. Cl.
 *H01L 21/4763* (2006.01)
(52) U.S. Cl. .......... 438/622; 257/E21.577; 257/E21.578
(58) Field of Classification Search ................. 438/622, 438/627, 636, 652–653, 656, 685, 687–688; 257/E21.577, E21.578, E21.585, E21.588
See application file for complete search history.

(56) References Cited

U.S. PATENT DOCUMENTS

| | | | |
|---|---|---|---|
| 4,782,380 A | 11/1988 | Shankar et al. | 357/71 |
| 4,847,674 A | 7/1989 | Sliwa et al. | 999/67 |
| 4,884,123 A | 11/1989 | Dixit et al. | 257/49 |
| 4,910,580 A | 3/1990 | Kuecher et al. | 999/71 |
| 4,924,295 A | 5/1990 | Kuecher | 999/71 |
| 4,960,732 A | 10/1990 | Dixit et al. | 999/192 |
| 4,962,060 A | 10/1990 | Sliwa et al. | 999/192 |
| 4,975,389 A | 12/1990 | Ryan et al. | 437/197 |
| 4,976,839 A | 12/1990 | Minoru | 204/192 |
| 5,051,812 A | 9/1991 | Onuki et al. | 999/71 |
| 5,084,412 A | 1/1992 | Nakasaki | 999/189 |
| 5,124,780 A | 6/1992 | Sandhu et al. | 999/67 |
| 5,231,053 A | 7/1993 | Bost et al. | 999/190 |
| 5,243,221 A | 9/1993 | Ryan et al. | 257/767 |
| 5,256,274 A | 10/1993 | Poris | 205/123 |
| 5,270,254 A | 12/1993 | Chen et al. | 999/190 |
| 5,289,035 A | 2/1994 | Bost et al. | 257/750 |
| 5,340,370 A | 8/1994 | Cadien et al. | 51/308 |
| 5,354,712 A | 10/1994 | Ho et al. | 999/195 |
| 5,364,810 A | 11/1994 | Kosa et al. | 999/52 |
| 5,366,911 A | 11/1994 | Lur et al. | 999/40 |
| 5,366,929 A | 11/1994 | Cleeves et al. | 999/195 |
| 5,368,711 A | 11/1994 | Poris | 204/193 |
| 5,371,410 A | 12/1994 | Chen et al. | 156/631 |
| 5,382,817 A | 1/1995 | Kashihara et al. | 257/295 |

(Continued)

OTHER PUBLICATIONS

Takamaro Kikkawa et al., "A Quarter-Micrometer Interconnection Technology Using a TiN/Al-Si-Cu/TiN/Al-Si-Cu/TiN/Ti Multilayer Structure," IEEE Transactions on Electron Devices, vol. 40, No. 2, Feb. 1993, pp. 296-302.

*Primary Examiner* — Walter L Lindsay, Jr.
(74) *Attorney, Agent, or Firm* — Fletcher Yoder

(57) ABSTRACT

A four layer interconnect structure is disclosed which includes a bottom conductive reactive layer such as titanium, a conductive barrier layer, such as titanium nitride, a conductive layer, such as aluminum-copper alloy, and a top conductive barrier layer, such as titanium nitride. The interconnection structure can be fabricated using conventional sputter deposition technology. The resulting interconnection structure provides a highly conductive thin film structure that provides good contact to tungsten plugs with small contact dimensions, good patternability on fine lines, and good reliability.

26 Claims, 1 Drawing Sheet

U.S. PATENT DOCUMENTS

| | | | |
|---|---|---|---|
| 5,387,550 A | 2/1995 | Cheffings et al. | 999/189 |
| 5,393,703 A | 2/1995 | Olowolafe et al. | 999/197 |
| 5,407,861 A | 4/1995 | Marangon et al. | 999/192 |
| 5,427,666 A | 6/1995 | Mueller | 204/192 |
| 5,534,463 A * | 7/1996 | Lee et al. | 438/643 |
| 5,591,671 A | 1/1997 | Kim | 999/190 |
| 5,817,574 A | 10/1998 | Gardner | 438/637 |
| 5,824,597 A | 10/1998 | Hong | 438/625 |
| 5,918,147 A | 6/1999 | Filipiak | 438/636 |
| 5,994,217 A * | 11/1999 | Ng | 438/636 |
| 6,110,828 A * | 8/2000 | Guo et al. | 438/688 |
| 6,133,636 A | 10/2000 | Akram | 257/761 |
| 6,204,167 B1 * | 3/2001 | Taniguchi | 438/627 |
| 6,217,721 B1 * | 4/2001 | Xu et al. | 204/192.17 |

* cited by examiner

ADVANCED VLSI METALLIZATION

CROSS-REFERENCE TO RELATED APPLICATIONS

This application is a divisional of application Ser. No. 08/815,031, filed on Mar. 14, 1997 now abandoned.

BACKGROUND OF THE INVENTION

1. Field of the Invention

The present invention generally relates to integrated circuit structures and, more particularly, to multilayer interconnection structures for VLSI devices.

2. Description of the Related Art

Thin films of aluminum and aluminum alloys are typically used as conducting materials to form interconnections between components and devices in integrated circuits. Aluminum's low resistivity, low cost, low weight and ability to adhere strongly to silicon and silicon oxide surfaces common in silicon-based semiconductor devices are some of the material's advantages in semiconductor fabrication.

As the dimensions of interconnects have decreased to the sub-micron level, failures of interconnects have increased for a variety of reasons, such as electromigration and stress-induced migration. Electromigration failures occur when ions of the conductor material migrate and leave voids in the conductor material. Voids in the conductor material can also occur during subsequent processing steps, such as subsequent metallization or insulation steps. Stress-induced cracks and voids in conductor materials can also lead to failures in integrated circuits.

Many three layer metallization structures have been used to form thin interconnects while attempting to prevent formation of voids within the interconnects. It should be understood that interconnects are typically disposed on dielectric material, except where the interconnects form an electrical contact with a plug or via, which is typically made of a conductive material. Therefore, the lower layer of the metallization structure should be capable of forming an adequate electrical connection with the conductive material used as a contact. As a first example, a three layer metallization structure has been used that contains titanium as the lower layer, aluminum (perhaps containing about 5% copper) as the middle layer, and titanium nitride as the top layer has been used. Since titanium reacts well with tungsten, it is a good choice for the bottom layer of the metallization stack. However, the middle layer of aluminum tends to react with the titanium to form $TiAl_3$. This reaction can form a void in the interconnect and, thus, cause an open circuit failure.

As a second example, a three layer metallization structure has been used where the structure includes a lower layer of titanium, a middle layer of aluminum or aluminum alloy, and a top layer of titanium. However, this structure suffers from the same problem mentioned in the first example. Specifically, the titanium and aluminum can react to form $TiAl_3$ and, thus, create a void in the interconnect.

By way of a third example, a three layer metallization stack having a bottom layer of titanium nitride, a middle layer of aluminum or aluminum alloy, and a top layer of titanium nitride has been used in an effort to avoid the problem mentioned above. However, this metallization structure does not contain a lower titanium layer to make a good electrical contact with a tungsten plug or a lower metallization layer of aluminum or tungsten.

Other multilayer conductors have been fabricated with the objective of improving the electrical and mechanical properties of aluminum interconnects. For example, a six layer interconnect structure of, from top to bottom, titanium nitride/aluminum-1% silicon-0.5% copper/titanium nitride/aluminum-1% silicon-0.5% copper/titanium nitride/titanium is said to provide improved electrical and mechanical properties. However, such complex multilayer conductors have many manufacturing disadvantages. In this example, it is difficult to form a six layer metallization structure on production wafers because of slow throughput. Also, the aluminum-silicon layers may for silicon precipitates during subsequent thermal processes that are difficult to remove during subsequent etches. Accordingly, a need exists for simpler multilayer conductors having the desired electrical and mechanical properties for use in integrated circuits.

SUMMARY OF THE INVENTION

In accordance with one aspect of the present invention there is provided an interconnect structure formed on a substrate. The structure includes a conductive reactive layer disposed on the substrate. A conductive barrier layer is disposed on the conductive reactive layer. A conductive layer is disposed on the conductive barrier layer. An anti-reflective layer is disposed on the conductive layer.

In accordance with another aspect of the present invention, there is provided an interconnect structure formed on a substrate. A titanium layer is coupled to the substrate. The titanium layer ranges in thickness from about 50 Å to about 1000 Å. A titanium nitride layer is coupled to the titanium layer. The titanium nitride layer ranges in thickness from about 50 Å to about 1000 Å. A layer of aluminum-0.5% copper alloy is coupled to the titanium nitride layer. The layer of aluminum-0.5% copper alloy ranges in thickness from about 1000 Å to about 10,000 Å. A titanium nitride layer is coupled to the layer of aluminum-0.5% copper alloy. The titanium nitride layer ranges in thickness from about 50 Å to about 1000 Å.

In accordance with a further aspect of the present invention, there is provided an interconnect structure that includes a first layer formed by depositing titanium on a substrate. A second layer is formed by depositing titanium nitride on the first layer. A third layer is formed by depositing aluminum copper alloy on the second layer. A fourth layer is formed by depositing titanium nitride on the third layer.

In accordance with yet another aspect of the present invention, there is provided a method of forming an interconnect structure. The method includes the steps of depositing a conductive reactive layer on a substrate, depositing a conductive barrier layer on the conductive reactive layer, depositing a conductive layer on the conductive barrier layer, and depositing an anti-reflective layer on the conductive layer.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Described below is a multilayer interconnection structure for integrated circuit devices. The interconnection structure can be fabricated using conventional deposition technology, such as physical or chemical vapor deposition. The resulting interconnection structure provides a highly conductive thin film structure that provides good contact to tungsten plugs with small contact dimensions, good patternability on fine lines, and good reliability. In addition, the resulting structure aids in avoiding the formation of sideway hillocks that can short tightly space lines, aids in preventing the formation of stress voids, and facilitates the etching of lines with good profiles due to the titanium nitride layer and the absence of silicon precipitates (if no silicon is used). Furthermore, the structure can be manufactured in conventional equipment, such as conventional four-chamber deposition reactor systems.

Figure 1:
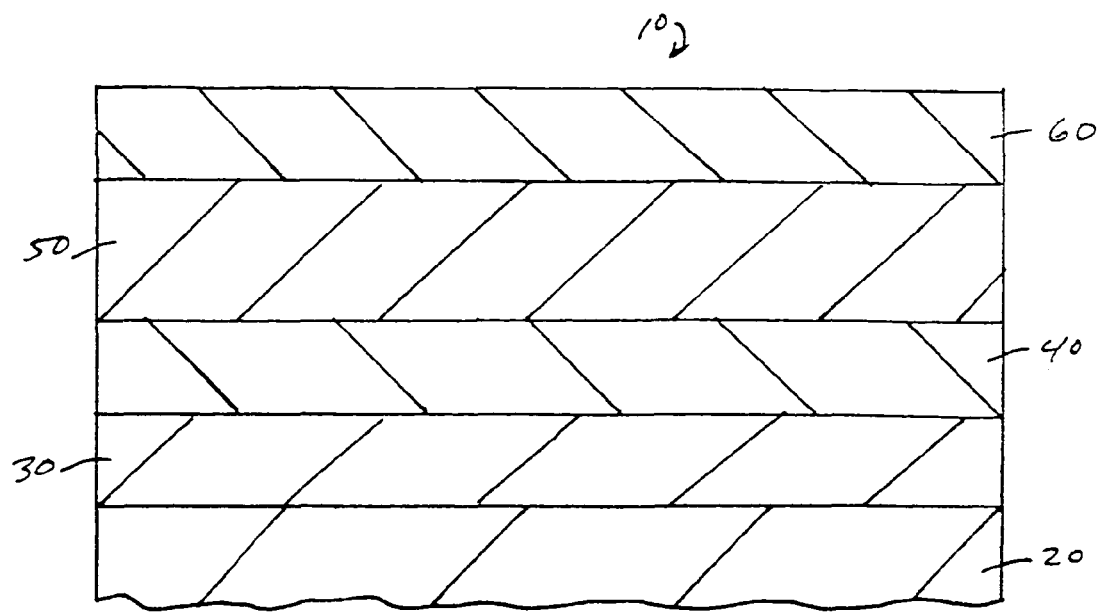
FIG. 1 is a general cross-sectional illustration of the multilayer interconnect structure of the present invention.

Turning now to the drawings, and referring initially to FIG. 1, an interconnection 10 is shown disposed on a substrate 20. The substrate 20 may be semiconductive or dielectric material, or it may be a contact or via, formed out of tungsten or an aluminum alloy for instance. The interconnection 10 consists of four layers, generally characterized as a reactive layer 30, a barrier layer 40, a conductive layer 50, and another barrier layer, or anti-reflective coating layer 60.

The reactive layer 30 is composed of a noble, near noble, or refractory metal, such as titanium advantageously. Other materials may be suitable, such as cobalt, tantalum, chromium, platinum, palladium, nickel, or tungsten for instance. The barrier layer 40 is advantageously composed of titanium nitride. Other barrier layer materials may be suitable, such as the nitrides of the materials listed above for instance. The conductive layer 50 is advantageously composed of copper or an aluminum alloy. Aluminum can be alloyed with such elements as copper, titanium, palladium, silicon, and the like to enhance electromigration resistance. Aluminum alloyed with 0.5% copper may be particularly advantageous. The top barrier anti-reflective coating layer 60 is advantageously composed of titanium nitride. Other suitable materials may include the nitrides mentioned previously. In one particular embodiment, the interconnect 10 is titanium/titanium nitride/aluminum-copper alloy/titanium nitride, where the bottom reactive layer 30 is titanium, the barrier layer 40 is titanium nitride, the conductive layer 50 is an aluminum-copper alloy, and the top barrier, or anti-reflective coating layer 60 is titanium nitride.

In one embodiment of the interconnect 10, the thickness of the bottom titanium reactive layer 30 may be about 50 Å to about 1000 Å, and the thickness is advantageously about 150 Å to 500 Å, such as about 300 Å. Similarly, the thickness of the titanium nitride barrier layer 40 may be about 50 Å to about 1000 Å, and the thickness is advantageously about 100 Å to about 300 Å, such as about 300 Å. The thickness of the aluminum-copper conductive layer 50 may be about 1000 Å to about 10,000 Å, and the thickness is advantageously about 2000 Å to 7000 Å, such as about 3000 Å. The thickness of the top titanium nitride layer 60 is about 50 Å to about 1000 Å, and the thickness is advantageously about 100 Å to about 300 Å, such as about 250 Å.

Figure 2:
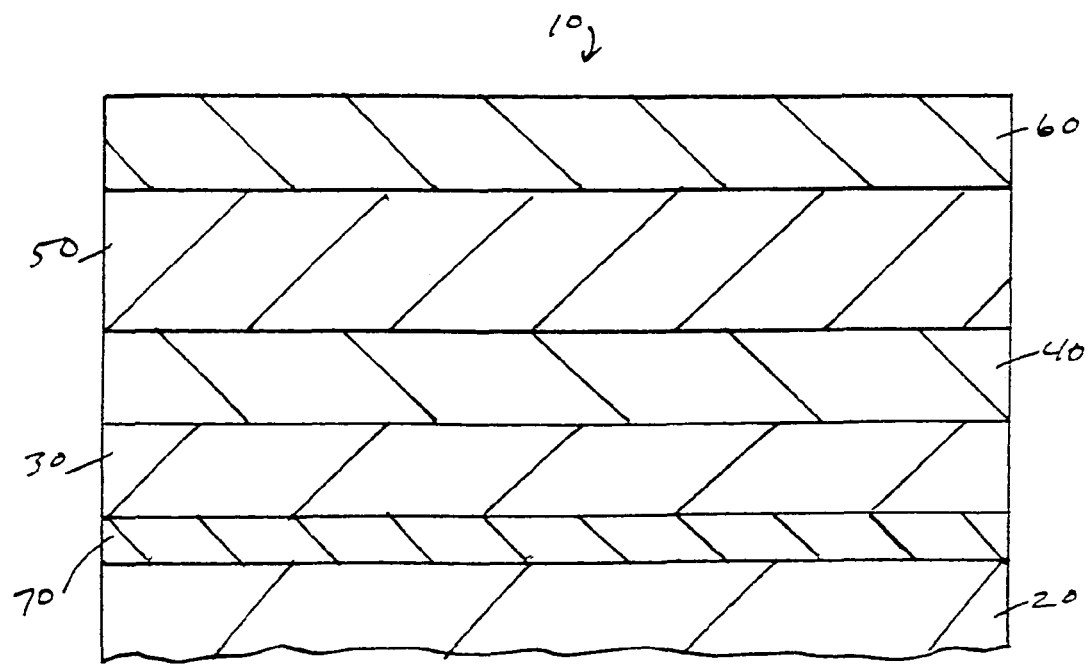
FIG. 2 is a cross-sectional illustration of a specific embodiment of a multilayer interconnect structure of the present invention.

Typically, other than the contacts, the substrate 20 on which the interconnect structure 10 is formed is a semiconductor substrate. The substrate 20 may be silicon, though insulators or dielectrics such as borophosphosilicate glass (BPSG), tetraethylorthosilicate (TEOS), or undoped oxides may also be used. A coating 70, such as silicon oxide, covering at least a portion of the substrate 20, as shown in FIG. 2., may be interposed between the layers 30, 40, 50, and 60 and the substrate 20.

As mentioned previously, the substrate 20 may also include other surface characteristics such as tungsten plugs filling vias and contact holes in the wafer surface. For example, if the interconnect 10 is used as a second, third, or fourth layer metal stack, then the vias will typically have an underlying metallization composed of tungsten, aluminum, or copper, and the vias may be plugged, typically with tungsten. In preparation for building the interconnect structure, surface oxides on underlying metal surfaces, such as underlying aluminum layers or tungsten plugs and the like, may be removed by, for example, a conventional RF sputter etch process.

The layers 30, 40, 50, and 60 may be formed on the substrate 20 by a variety of means including physical vapor deposition (sputtering or evaporation) and chemical vapor deposition, with sputtering being particularly advantageous. By way of illustration, a method of manufacturing the interconnect 10 is by DC magnetron sputtering. For example, an Endura® multi-chamber physical vapor deposition system manufactured by Applied Materials, Inc. may be used under the following conditions: gas: argon or nitrogen; pressure: 1 to 4 m Torr; substrate heating: ambient for titanium and titanium nitride; 250° C. for aluminum-0.5% copper alloy; power: 11 kW for titanium and aluminum-0.5% copper alloy; 2 kW for titanium nitride. Prior to deposition of the reactive layer 30 in the interconnect structure 10, an RF etch is conducted to remove native oxides. The etch maybe carried out in an argon ambient for 40 seconds with 350 Watts applied to the substrate 20 and 500 Watts applied to the RF coil.

Chemical vapor deposition may also be used to form the interconnect 10. However, it is difficult to deposit copper in aluminum using CVD processes. Therefore, with regard to the deposition of the aluminum-copper layer, aluminum may be deposited by CVD, and a mixture of aluminum and copper may be sputtered on top of the aluminum layer so that the copper will diffuse into the aluminum layer. The titanium and titanium nitride layers may, of course, be deposited by conventional techniques.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of forming an interconnect structure, comprising the acts of:
    depositing a single conductive reactive layer directly on a substrate;
    depositing a single conductive barrier layer directly on the conductive reactive layer;
    depositing a single conductive layer directly on the conductive barrier layer; and
    depositing an anti-reflective layer on the conductive layer
    wherein the act of depositing a conductive reactive layer comprises the act of depositing the conductive reactive layer directly on a conductive contact portion of the substrate.

2. The method of claim 1, wherein the act of depositing the conductive reactive layer comprises the act of depositing titanium.

3. The method of claim 1, wherein the act of depositing the conductive barrier layer comprises the act of depositing titanium nitride.

4. The method of claim 1, wherein the act of depositing the conductive layer comprises the act of depositing aluminum-0.5% copper alloy.

5. The method of claim 1, wherein the act of depositing the anti-reflective layer comprises the act of depositing titanium nitride.

6. The method of claim 1, wherein the acts of depositing comprise sputter deposition.

7. The method of claim 1, wherein the acts of depositing comprise a combination of sputter deposition and chemical vapor deposition.

8. The method of claim 1, comprising the act of etching the substrate prior to the acts of depositing.

9. A method of forming an interconnect structure, comprising the acts of:
   depositing a single conductive reactive layer directly on a substrate;
   depositing a single conductive barrier layer directly on the conductive reactive layer;
   depositing a single conductive layer directly on the conductive barrier layer; and
   depositing an anti-reflective layer on the conductive layer,
   wherein the act of depositing a conductive reactive layer comprises the act of depositing the conductive reactive layer directly on a semiconductive portion of the substrate.

10. The method of claim 1, wherein the act of depositing a conductive reactive layer comprises the act of depositing the conductive reactive layer directly on a dielectric portion of the substrate.

11. A method of forming an interconnect structure, comprising the acts of:
    depositing a single conductive reactive layer directly on a substrate;
    depositing a single conductive barrier layer comprising tantalum nitride directly on the conductive reactive layer;
    depositing a copper layer directly on the conductive barrier layer; and
    depositing an anti-reflective layer comprising tantalum nitride directly on the copper layer
    wherein the act of depositing a conductive reactive layer comprises the act of depositing the conductive reactive layer directly on a conductive contact portion of the substrate.

12. The method of claim 11, wherein the act of depositing the conductive reactive layer comprises the act of depositing tantalum.

13. The method of claim 11, wherein the acts of depositing comprise sputter deposition.

14. The method of claim 11, wherein the acts of depositing comprise a combination of sputter deposition and chemical vapor deposition.

15. The method of claim 11, comprising the act of etching the substrate prior to the acts of depositing.

16. A method of forming an interconnect structure, comprising the acts of:
    depositing a single conductive reactive layer directly on a substrate;
    depositing a single conductive barrier layer comprising tantalum nitride directly on the conductive reactive layer;
    depositing a copper layer directly on the conductive barrier layer; and
    depositing an anti-reflective layer comprising tantalum nitride directly on the copper layer,
    wherein the act of depositing a conductive reactive layer comprises the act of depositing the conductive reactive layer directly on a semiconductive portion of the substrate.

17. The method of claim 11, wherein the act of depositing a conductive reactive layer comprises the act of depositing the conductive reactive layer directly on a dielectric portion of the substrate.

18. A method of forming an interconnect structure, comprising the acts of:
    depositing a tantalum layer directly on a substrate;
    depositing a first tantalum nitride layer directly on the tantalum layer;
    depositing a conductive layer comprising at least one of copper and a copper alloy directly on the first tantalum nitride layer; and
    depositing a second tantalum nitride layer directly on the conductive layer
    wherein the act of depositing a tantalum layer on the substrate comprises the act of depositing the tantalum layer directly on a conductive contact portion of the substrate.

19. The method of claim 18, wherein the act of depositing the conductive layer comprises the act of depositing copper.

20. The method of claim 18, wherein the act of depositing the conductive layer comprises the act of depositing an aluminum/copper alloy.

21. The method of claim 20, wherein the aluminum/copper alloy comprises 99.5% aluminum and 0.5% copper.

22. The method of claim 18, wherein the acts of depositing comprise sputter deposition.

23. The method of claim 18, wherein the acts of depositing comprise a combination of sputter deposition and chemical vapor deposition.

24. The method of claim 18, comprising the act of etching the substrate prior to the acts of depositing.

25. A method of forming an interconnect structure, comprising the acts of:
    depositing a tantalum layer directly on a substrate;
    depositing a first tantalum nitride layer directly on the tantalum layer;
    depositing a conductive layer comprising at least one of copper and a copper alloy directly on the first tantalum nitride layer; and
    depositing a second tantalum nitride layer directly on the conductive layer,
    wherein the act of depositing a tantalum layer on the substrate comprises the act of depositing the tantalum layer directly on a semiconductive portion of the substrate.

26. The method of claim 18, wherein the act of depositing a tantalum layer on the substrate comprises the act of depositing the tantalum layer directly on a dielectric portion of the substrate.

* * * * *